United States Patent [19]
Piot et al.

[11] Patent Number: 5,911,627
[45] Date of Patent: Jun. 15, 1999

[54] ELECTROMAGNETIC JOYSTICK USING VARYING OVERLAP OF COILS AND CONDUCTIVE ELEMENTS

[75] Inventors: Julien Piot, Rolle; Patrick Favre, Gollion; Marc Bidiville, Pully; Florian Kehlstadt, Aclens; Antoine Merminod, Treytorrens, all of Switzerland

[73] Assignee: Logitech, Inc., Fremont, Calif.

[21] Appl. No.: 08/956,840

[22] Filed: Oct. 23, 1997

[51] Int. Cl.⁶ ......................................................... A63F 9/22
[52] U.S. Cl. ........................................ 463/38; 273/148 B
[58] Field of Search ................................ 463/38, 39, 37, 463/36; 273/148 B

[56] References Cited

U.S. PATENT DOCUMENTS

| | | | |
|---|---|---|---|
| 4,255,626 | 3/1981 | Watts et al. ................................. | 200/6 |
| 4,305,007 | 12/1981 | Hughes .................................. | 307/116 |
| 4,369,397 | 1/1983 | Read ...................................... | 318/54 |
| 4,439,648 | 3/1984 | Reiner et al. ............................... | 200/6 |
| 4,458,226 | 7/1984 | Cho . | |
| 4,459,022 | 7/1984 | Morey ..................................... | 356/152 |
| 4,459,578 | 7/1984 | Sava et al. . | |
| 4,489,303 | 12/1984 | Martin .................................... | 338/128 |
| 4,533,827 | 8/1985 | Fincher ................................... | 250/211 |
| 4,607,159 | 8/1986 | Goodson et al. ......................... | 250/221 |
| 4,639,667 | 1/1987 | Andresen . | |
| 4,642,595 | 2/1987 | Ruumpol et al. ......................... | 336/135 |
| 4,654,576 | 3/1987 | Oelsch et al. ............................. | 322/3 |
| 4,685,678 | 8/1987 | Frederiksen ............................. | 273/148 |
| 4,731,530 | 3/1988 | Mikan .................................... | 250/231 |
| 4,825,157 | 4/1989 | Mikan .................................... | 324/208 |
| 4,855,704 | 8/1989 | Betz ....................................... | 336/132 |
| 4,856,785 | 8/1989 | Lantz et al. ............................... | 273/148 |
| 4,879,556 | 11/1989 | Duimel .................................... | 341/20 |
| 4,994,669 | 2/1991 | Stern ....................................... | 250/229 |
| 5,043,709 | 8/1991 | Kim ........................................ | 340/709 |
| 5,117,102 | 5/1992 | Mitchell .................................. | 250/229 |
| 5,128,671 | 7/1992 | Thomas, Jr. ............................... | 341/20 |
| 5,160,918 | 11/1992 | Saposnik et al. ......................... | 340/709 |
| 5,164,722 | 11/1992 | Laroze et al. ............................. | 341/20 |
| 5,181,079 | 1/1993 | Klinger ................................... | 356/375 |
| 5,409,074 | 4/1995 | Wilson et al. ............................. | 180/6.5 |
| 5,532,529 | 7/1996 | Codina et al. . | |
| 5,559,432 | 9/1996 | Logue . | |
| 5,598,090 | 1/1997 | Balser et al. . | |
| 5,621,207 | 4/1997 | O'Mara ................................... | 250/221 |
| 5,687,080 | 11/1997 | Hoyt et al. ............................... | 364/190 |

FOREIGN PATENT DOCUMENTS

| | | | |
|---|---|---|---|
| 0 126 223A2 | 2/1984 | European Pat. Off. ......... | G01D 5/32 |
| 0 466 298A1 | 4/1991 | European Pat. Off. ......... | G01D 5/34 |
| 9006527 | 1/1997 | Japan .............................. | G06F 3/033 |
| 1 472 066 | 6/1974 | United Kingdom .............. | G01S 5/16 |

*Primary Examiner*—Michael O'Neill
*Attorney, Agent, or Firm*—Townsend and Townsend and Crew LLP

[57] ABSTRACT

A joystick having an electromagnetic element coupled to a movable stick, with at least a pair of orthogonal coils on an underlying substrate. Alternately, the coils and electromagnetic elements can be reversed. The movement of the stick is detected by the amount of overlap of the electromagnetic element and the coils in each direction. The quality factor of the coil changes as more or less of the coil is overlapped, which can be measured by an electric circuit to determine the direction of movement and the amount of movement of the joystick. The electromagnetic element could be, for instance, a conductive steel plate, or a piece of another metal or of another conductive material, or ferrite particles. The coil could be wound (preferably on air only or, if needed to reach a higher value of inductance, on a magnetic core, provided this is small enough to not hide the effect of the mobile electromagnetic element). Or the coils could be made from traces on a printed circuit board (PCB), provided the use of a high enough (greater than 1 MHz) driving frequency, eliminating the need for a large, expensive wound coil.

33 Claims, 6 Drawing Sheets

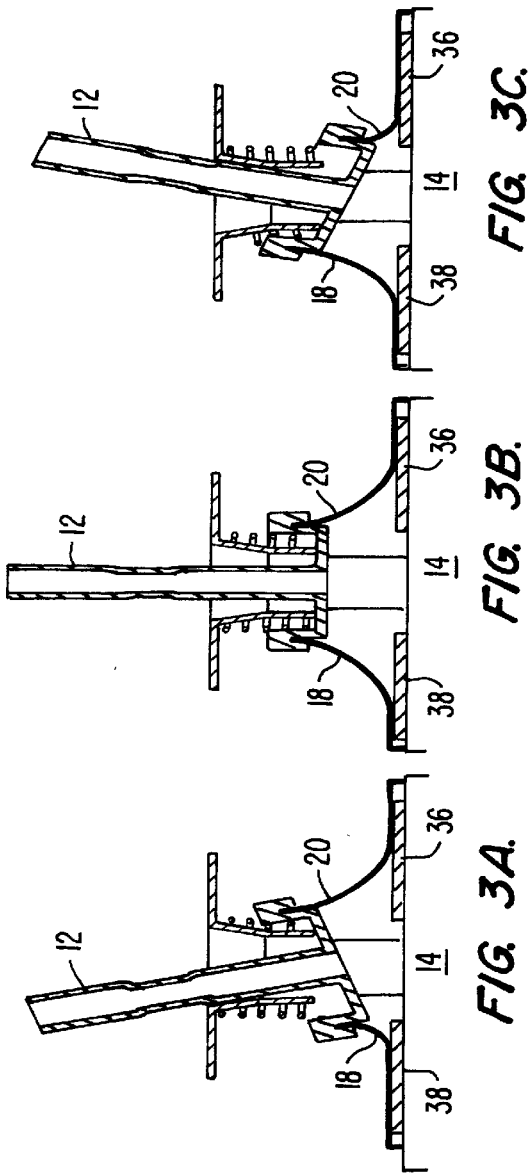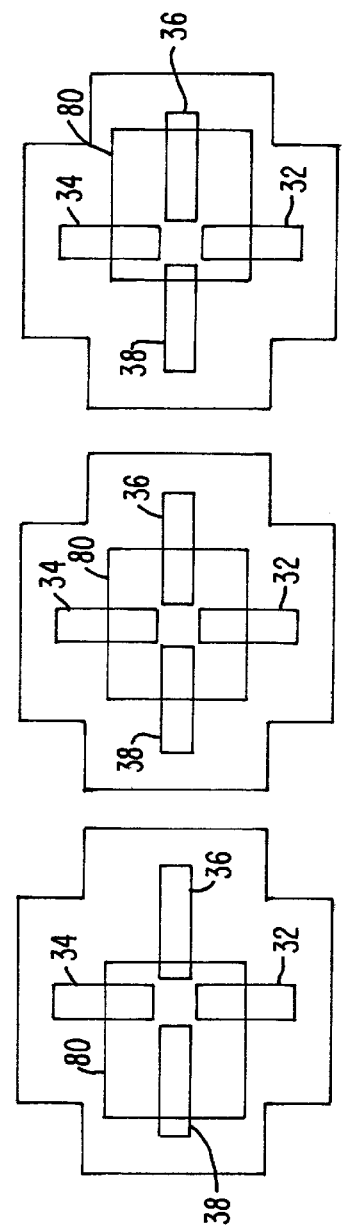

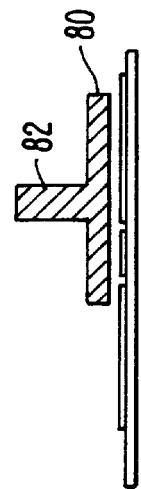
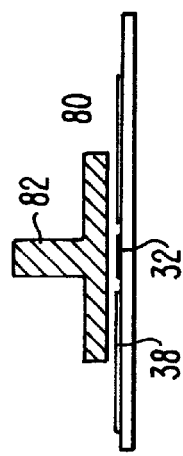
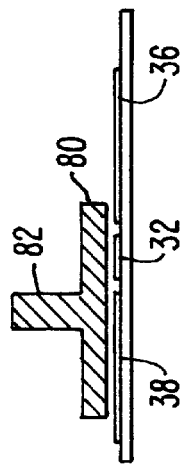
FIG. 4A2. FIG. 4B2. FIG. 4C2.
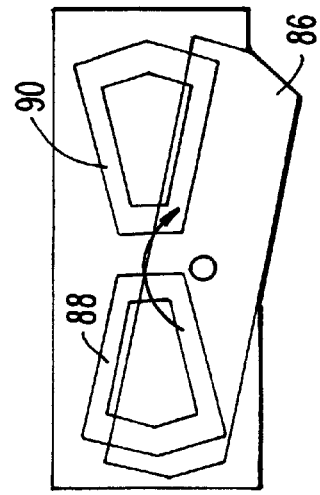
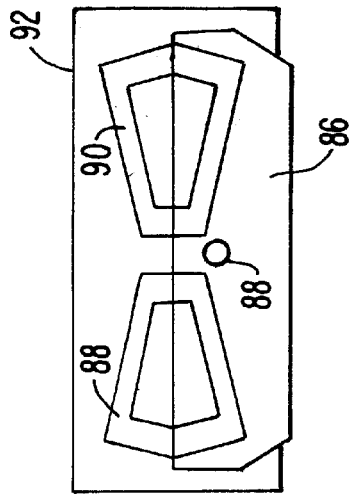
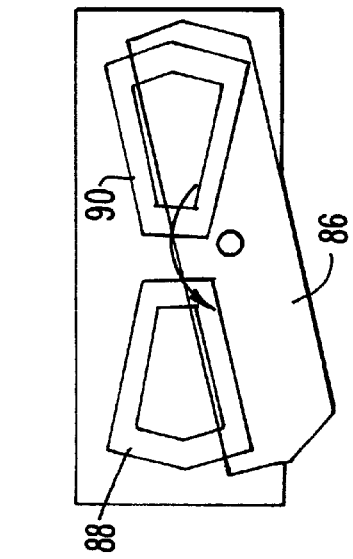
FIG. 5A. FIG. 5B. FIG. 5C.

ELECTROMAGNETIC JOYSTICK USING VARYING OVERLAP OF COILS AND CONDUCTIVE ELEMENTS

BACKGROUND OF THE INVENTION

The present invention relates to joysticks, and in particular to joysticks which use inductive coils to detect movement.

Many different mechanisms have been used to detect movement of a joystick. One type of joystick uses potentiometers, with a joystick moving a wiper on the potentiometer. Other types of joystick have attempted to avoid any mechanical interaction to increase the joystick lifetime. For example, numerous types of optical joystick designs have been developed. Other joysticks use electromagnetic sensing, such as by using Hall-effect sensors. A number of joysticks are designed to use induction coils, with the amount of inductance varying and being detected by an electric circuit.

For example, U.S. Pat. No. 4,685,678 and U.S. Pat. No. 4,855,704 show induction coil joysticks. In U.S. Pat. Nos. 4,879,556 and 4,642,595, a transmitter coil is included on the stick of the joystick, and is surrounded by receiving coils. Another type of design is shown in U.S. Pat. No. 4,654,576, where a metal disk is attached to the stick, with coils mounted on different sides of it. The metal disk has a tapered bottom, and as the joystick is tilted, the disk will come closer to certain coils, changing the inductance, which can then be measured by an electric circuit.

A number of different electric circuit designs are used to measure the movement of electromagnetic joysticks. Examples of some patents which show using either differential detection, or illustrate the use of oscillators in electric circuits, are U.S. Pat. No. 4,305,007 and U.S. Pat. No. 4,685,678.

SUMMARY OF THE INVENTION

The present invention provides a joystick having an electromagnetic element coupled to a movable stick, with at least a pair of orthogonal coils on an underlying substrate. Alternately, the coils and electromagnetic elements can be reversed. The movement of the stick is detected by the amount of overlap of the electromagnetic element and the coils in each direction. The quality factor of the coil changes as more or less of the coil is overlapped, which can be measured by an electric circuit to determine the direction of movement and the amount of movement of the joystick. The electromagnetic element could be, for instance, a conductive steel plate, or a piece of another metal or of another conductive material, or ferrite particles. The coil could be wound (preferably on air only or, if needed to reach a higher value of inductance, on a magnetic core, provided this is small enough to not hid the effect of the mobile electromagnetic element). Or the coils could be made from traces on a printed circuit board (PCB), provided the use of a high enough (greater than 1 MHz) driving frequency, eliminating the need for a large, expensive wound coil.

In one embodiment, flexible steel plates are attached to the stick at one end, and to a printed circuit board (PCB) at the other. The blades are attached to the stick so that when the stick moves, the blades bend, bringing a portion of the blade closer or farther from a conductor on the underlying PCB. The PCB includes four coils arranged in a cross configuration. Preferably, in a rest position, the plates are in contact with a portion of the coils, preferably up to the midpoint.

In one embodiment, an electric circuit is used which generates a resonate frequency with the coil and an added capacitor. Variations in the impedance of the resonant circuit are caused by movement of the plates, which can then be measured differentially between the two coils on each axis. As one plate covers up more of the coil, the other plate will uncover more of the coil on its side.

The present invention also provides an improved measurement circuit where each of the coils forms part of a different resonant circuit. An impedance measurement is done at a node connecting the source impedance of an oscillator driving the resonant circuit, and the resonant circuit itself. This allows the measurement of an impedance in a similar manner to a voltage divider. As an absorbing metal increases proximity to the coils, not only does the inductance change, but the quality factor of the resonant circuit changes, with both contributing to a change in impedance. This gives increased sensitivity to small changes in the movement of the metal.

For a further understanding of the nature and advantages of the invention, reference should be made to the following description taken in conjunction with the accompanying drawings.

BRIEF DESCRIPTION OF THE DRAWINGS

FIGS. 3A–3C are diagrams illustrating the movement of a joystick according to the present invention.

FIGS. 4A1–4C1 and 4A2–4C2 are diagrams illustrating the movement of a joystick having a single plate with translational overlap of coils.

FIGS. 5A–5C are diagrams illustrating an alternate embodiment in which the coils are mounted vertically opposite a rotating plate.

DETAILED DESCRIPTION OF THE PREFERRED EMBODIMENTS

Figure 1:
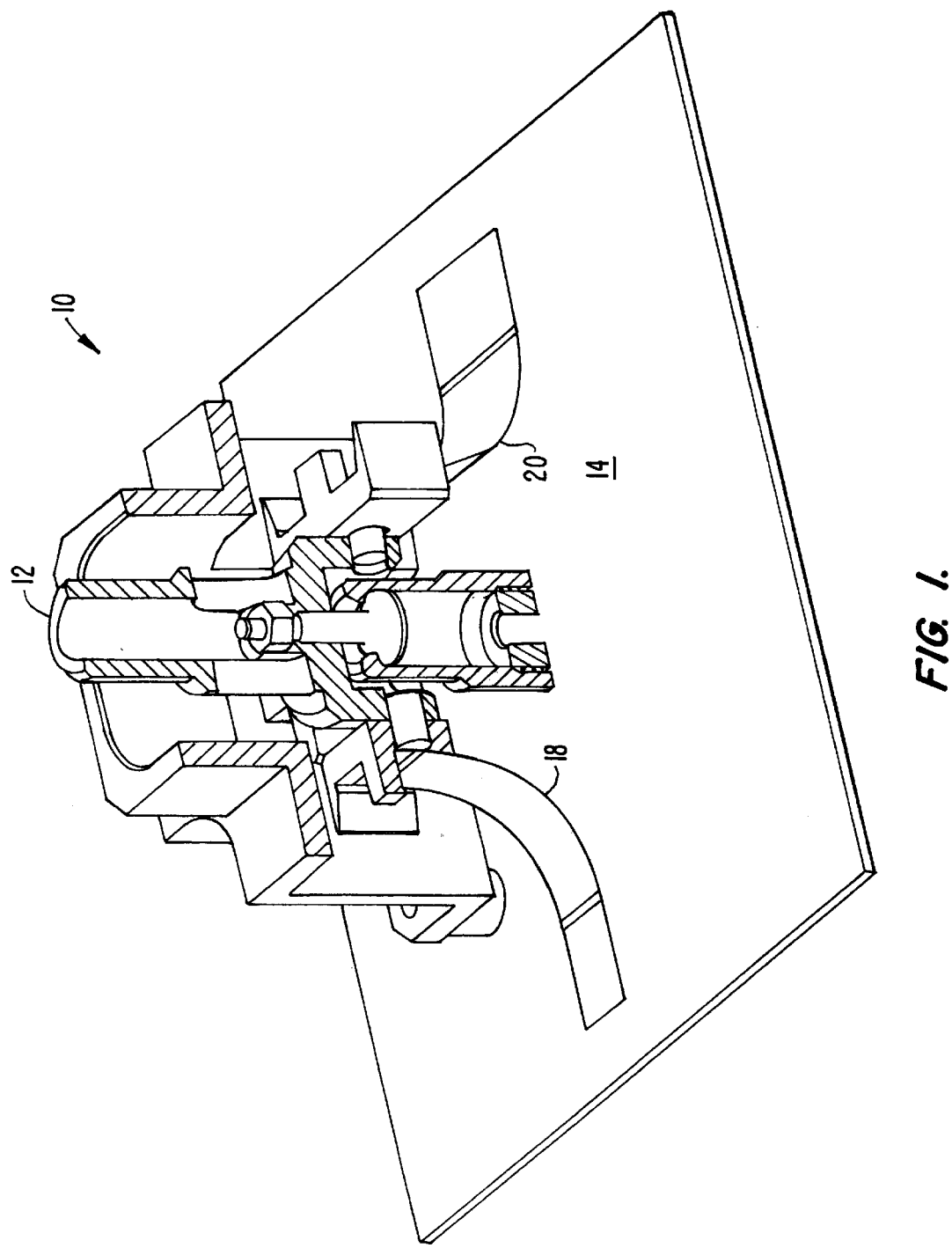
FIG. 1 is a perspective view of one embodiment of the invention.

FIG. 1 illustrates the base portion 10 of a joystick showing a stick 12 onto which a handle can be attached for a user to manipulate. The base of the stick extends through a printed circuit board (PCB) 14 to an underlying baseplate. A pair of flexible, steel blades 18 and 20 are connected to stick 12 and the PCB 14. In a preferred embodiment, additional steel blades would be connected along an orthogonal axis to give four steel blades in total.

Figure 2:
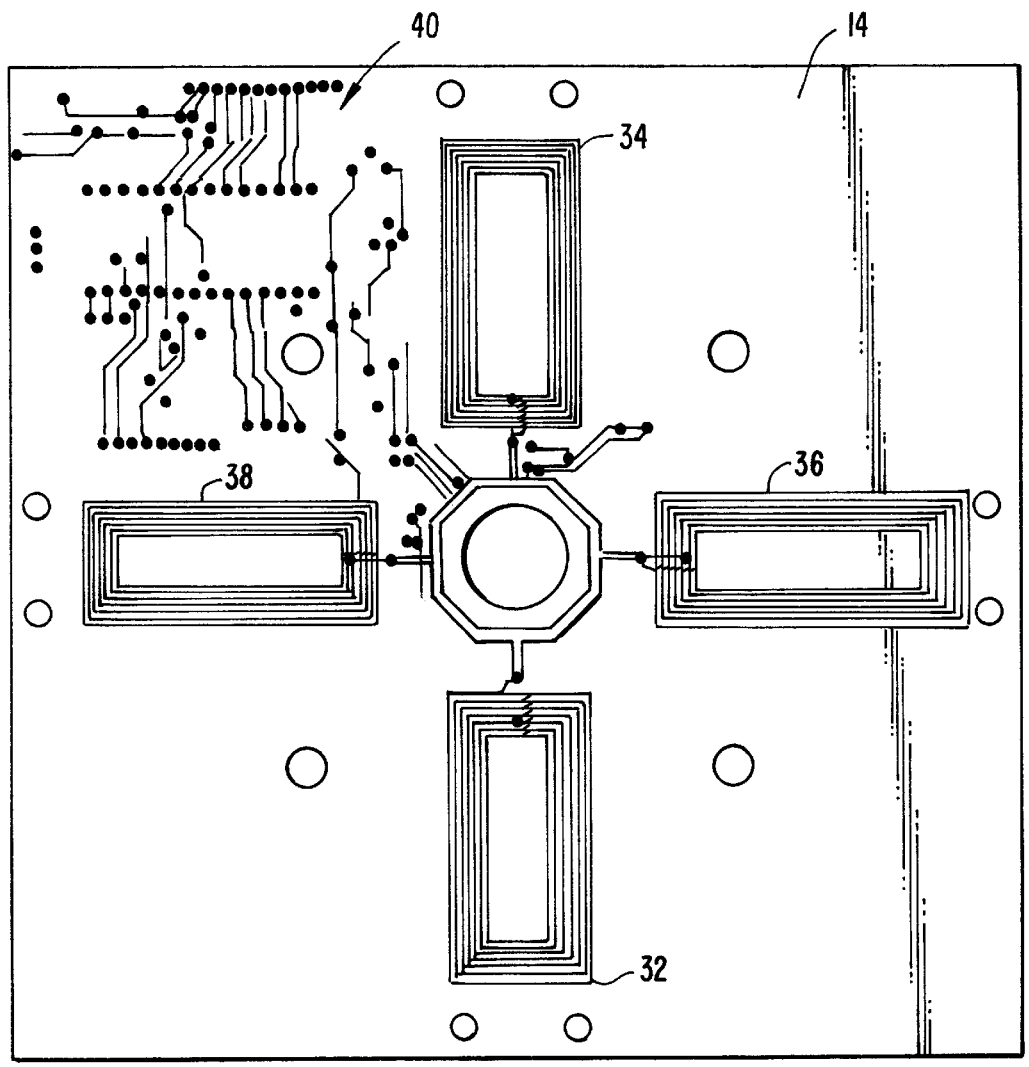
FIG. 2 is a diagram illustrating the circuit board traces with the coils on the PCB of FIG. 1.

FIG. 2 illustrates the metal traces on PCB 14. A first coil 32 is positioned beneath steel blade 14, while a second coil 34 is positioned beneath blade 20. Additional coils 36 and 38 would be positioned beneath additional steel blades (not shown in FIG. 1 for clarity).

Referring back to FIG. 1, blades 18 and 20 can have their ends free, so that as stick 12 is tilted, they slide farther away from the center of the PCB. Alternately, the ends of the blades can be screwed, riveted or otherwise attached to the PCB so that the blades don't move, but rather flex as the stick 12 is rotated. As the stick is rotated in one direction, one blade will flex down, and the other flex up, varying the amount of overlap between the blade and the underlying coil. When the blade slides across the area of the coil, the amount of overlap will increase or decrease, causing a change in the quality factor of the coil which can be measured. In the embodiment where the blades are attached to the PCB, these blades can also act as springs which provide a mechanical centering force for stick 12. Alternately, separate springs could be used for the sliding version of the blades.

Also shown in FIG. 2 are traces 40 for an electric circuit to measure the change in impedance of a resonant circuit due to changes in the quality factor of the coils as the steel blades cover more or less of each coil. A block diagram of the circuit is included in FIG. 9 below. The traces shown in FIG. 2 are covered with an insulating layer to protect them from wear by the steel blades and to avoid short circuits (or the coils could be on the other side of the PCB).

Generally, in operation, the steel blades are positioned such that when the stick 12 is at a central, rest position, each steel blade will cover between 25% and 75%, preferably about one-half, of its corresponding coil, but in any case the same area of both coils. This provides a centered position such that if the steel blade covers more or less of the coil, the quality factor is varied from the central point approximately equal amounts in both directions. By using differential detection, the accuracy can be further enhanced, while the variations that depend on factors like temperature, power supply voltage etc. are self-compensated, and the center (rest) position can be located independently of the sensitivity of the electronic circuitry. In one embodiment, the amount of the coil overlapped by the steel plate can vary from between a minimum amount of 10–25% to a maximum amount of 75–90%.

In the embodiment shown, each coil includes seven turns or loops, with each trace being 15 mils across, and having a gap between traces of 15 mils. Although rectangular coils have been shown, other coil configurations could be used. For example, the coils could be square, trapezoidal or a curved triangle or curved trapezoid. The curved triangle (trapezoid) could be used as a way to correct for the linearity of the variation of impedance Vs. the relative position of the coil and the metal or other conductive part.

In alternate embodiments, instead of steel blades, either rubber or plastic could be used, with either metal traces or embedded ferrite or metal particles to provide the necessary electromagnet element to vary the quality factor of the coils. The blades are insulated from each other, or connected together to form a single blade. In an alternate embodiment, where plastic or other materials are used for the blades, the coils could be placed on the blades themselves, with the PCB board (or simply a base substrate) containing a steel plate or other conductive material, in a fixed position. In an alternate embodiment, the coils could be made of flexible PCB, flexing above a steel plate in a fixed position, or other conductive material in a fixed position.

In addition, the steel blades could be mounted in other manners than as shown, and still flex and vary the amount of coil covered. For example, the portion near the PCB board may be higher than the portion near the joystick, the curvature could be reversed, etc. Alternately, instead of the steel blade being fixed to the PCB board by a screw, it could be loose, optionally within guides, so that it can move laterally. Thus, a combination of bending and lateral movement would vary the amount of the blade over the coil. In an alternate embodiment, the coils could be printed on a bottom side of a PCB board, with the PCB itself providing the insulating layer needed to protect the traces. In yet another embodiment, the coils could be on both sides of the PCB board, connected together through a via to form a single coil. This would allow either a larger value of inductance to be achieved on the same footprint, or the same value of inductance to be placed in a smaller footprint.

FIGS. 3A–3C illustrate the operation of the joystick of FIG. 1. As shown in FIG. 3A, stick 12 is tilted to the left, flexing plate 18 so that it covers most of coil 38. At the same time, plate 20 is stretched, uncovering a portion of coil 36. Thus, the overlap of plate 18 and coil 38 increases, while the overlap of plate 20 and coil 36 decreases. This can be detected from either coil, or through differential detection to increase the accuracy, to reduce the variations that depend on factors like temperature, power supply voltage etc., and, before all, to locate the center (rest) position independently of the sensitivity of the electronic circuitry.

FIG. 3B shows the joystick in the centered position, with each coil equally overlapped. FIG. 3C shows the stick 12 tilted to the right, resulting in more overlap between plate 20 and coil 36, and less overlap between plate 18 and coil 38. (Please note that the dimensions of the blades and coils in FIGS. 3A–3C have been exaggerated to illustrate the operation of the invention).

FIGS. 4A–4C show an alternate embodiment of the invention in which a square plate 80 is attached to a stick 82. As the stick is rotated, plate 80 moves translationally, or parallel to the coils, to vary the amount of overlap of the four coils 32, 34, 36, and 38. FIG. 4 is broken up into FIGS. 4A1–4C1, showing a diagram of the movement from a top view, while FIGS. 4A2–4C2 illustrate a diagram of the movement from a side view.

FIGS. 4B1 and 4B2 illustrate a center position, in which plate 80 equally overlaps the coils. FIGS. 4A1 and 4A2 illustrate plate 80 moving to the left, to have more overlap of coil 38, and less of coil 36. No up or down movement has occurred, and accordingly coils 32 and 34 are equally overlapped at this point, and therefore no movement is measured in the vertical direction. The opposite movement is shown in FIGS. 4C1 and 4C2, wherein the plate 80 moves to the right, causing an increased overlap of coil 36, and less overlap of coil 38.

Figure 6:
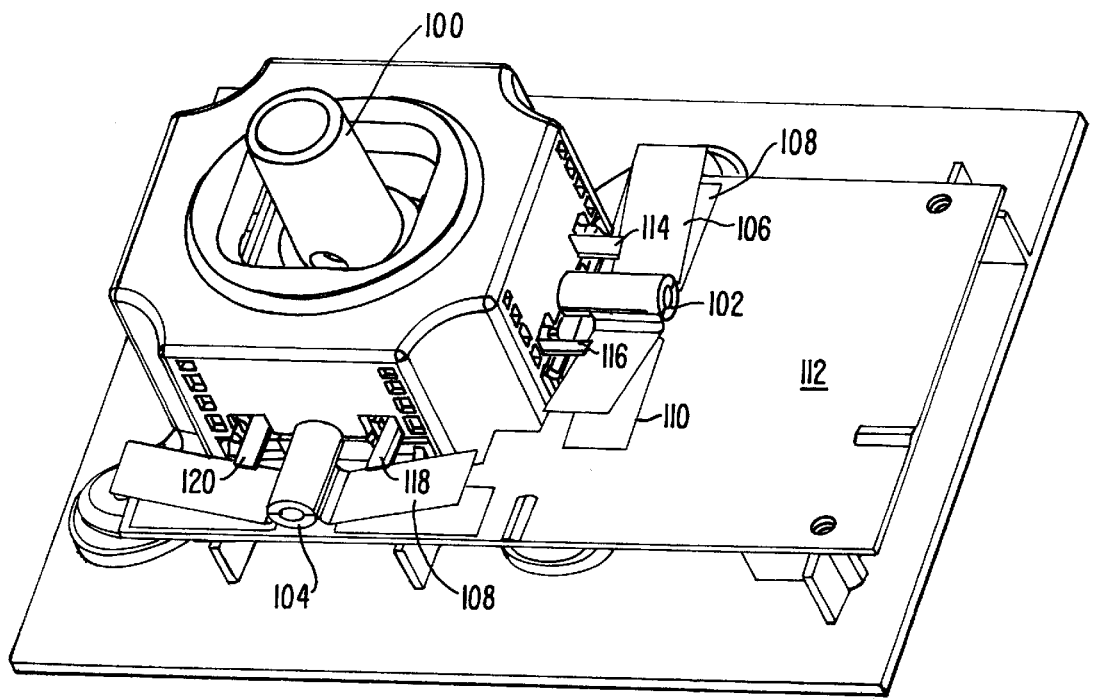
FIG. 6 is a perspective view of an alternate embodiment of the invention using rotating, V-shaped wings for the steel plates.
Figure 7A:
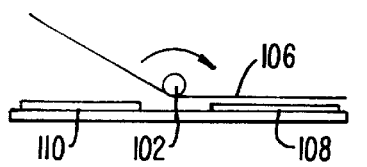
FIGS. 7A–7C are diagrams illustrating the movement of the V-shaped wings of FIG. 6.
Figure 7B:
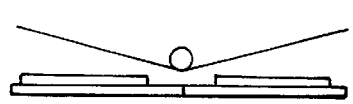
Figure 7C:

FIG. 6 is a perspective view of another embodiment of the invention showing a joystick having a central stick 100 connected to extending arms 102 and 104 through a universal joint (Cardan joint) that separates the bi-directional movement of the stick 100 into two separated rotations of the arms 102 and 104 along their axis. Thus, as stick 100 moves, arms 102 and 104 will rotate, causing the V-shaped plates 106 and 108 to rotate up and down, as illustrated in FIGS. 7A–7C for plate 106. As the two V-wings of plate 106 move up and down, they come closer to or farther from underlying coils 108 and 110 on a PCB 112.

In one embodiment, arms 102 and 104 could be caused to rotate as stick 100 is tilted. Alternately, arms 102 and 104 could simply be supports for the V-shaped member wrapped around it, with extending members 114, 116, 118, and 120 connected to the plates for rigidity. The V-shaped members can be caused to rotate as one or other of members 114-120 are forced downward or upward. These members 114–120 could extend past stick 100, and be moved upward or downward by movement of stick 100.

Figure 8A:
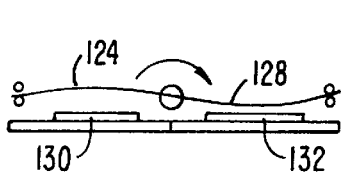
FIGS. 8A–8C are diagrams illustrating an alternate embodiment in which plates, fixed at the ends, are flexed by rotational movement.
Figure 8B:
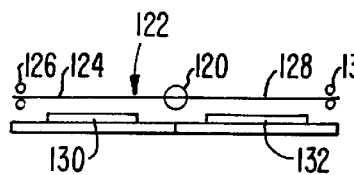
Figure 8C:
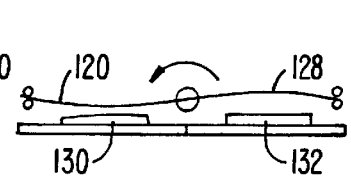

FIGS. 8A–8C illustrate an alternate embodiment of the invention. As in FIG. 1, the flexible plates are connected both to the stick and to the support structure at the far ends of the plates. However, instead of the plate simply tilting to one side, the arm 102 or 104 (of FIG. 6) is mounted to the center portion 120 of a single flexible steel plate 122. Plate 122 has a first side 124 anchored at a point 126, and a second side 128 anchored at a point 130. As illustrated in FIG. 8A, as the stick rotates to the right, plate 122 is twisted, such that portion 124 is twisted upward, and portion 128 is twisted downward. Thus, portion 124 is farther away from a first coil 130, while portion 128 is closer to a second coil 132. As illustrated in FIG. 8C, when twisting the stick to the left, portion 124 becomes closer to coil 130, while portion 128 is farther away from coil 132. Thus, the direction and amount of movement can be detected by individual or differential sensing of the coils.

FIGS. 5A–5C illustrate an alternate embodiment of the invention. Again, as in the other figures showing movement, this is a diagram and is not intended to indicate the exact structure. FIGS. 5A–5C show a vertical plate 86, which rotates about an axis 89 (which in fact is the arm 104 of FIG. 6). Plate 86 is adjacent to vertical coils 88 and 90, mounted on a vertical PCB 92.

FIG. 5B shows the center position, in which the overlap of coils 88 and 90 by plate 86 is equal. In FIG. 5A, stick 100 is tilted to the left, causing less overlap of coil 88 and more overlap of coil 90. In FIG. 5C, stick 100 is tilted to the right, causing more overlap of coil 88 and less overlap of coil 90.

Figure 9:
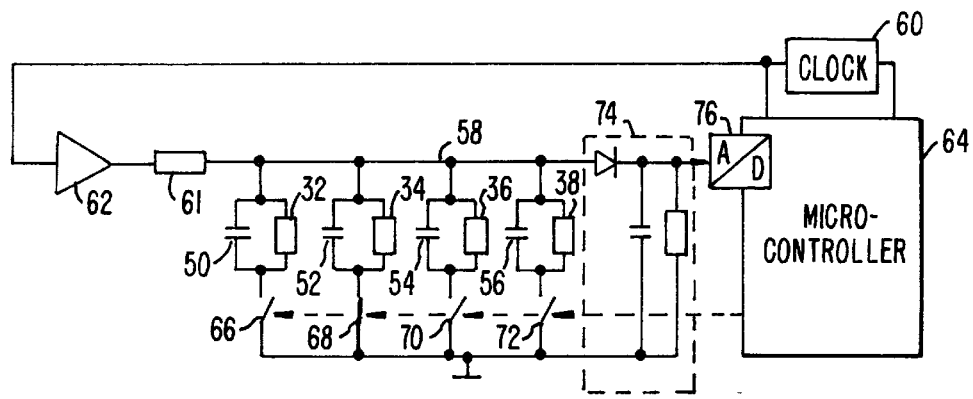
FIG. 9 is a block diagram of an electronic circuit for measuring the joystick position.

FIG. 9 is a block diagram of an electric circuit for use with the present invention. FIG. 9 shows the four inductive coils 32, 34, 36, and 38 also shown in FIG. 2. Each of the coils includes a capacitor in parallel with a deformer resonant circuit, shown as capacitors 50, 52, 54 and 56. As will be understood by those with skill in the art, the resonant circuits may include other impedances as well, but they are not shown here to avoid obscuring the invention. Each of the resonant circuits is connected together at a common node 58. This node is driven by an oscillator 60 through a driver or amplifier 62 to provide a resonant condition. (N.B. embodiments where all the coils would share one single capacitor from the common node 58 to the reference ground are possible: that configuration would save three precision capacitors, but would show degraded performances due to a more complex layout).

A controller 64 sequentially connects each of the resonant circuits to ground to activate a particular resonant circuit. This is done through switches 66, 68, 70 and 72 (FIG. 9 shows the switch 68 closed, thus the L34-C52 circuitry is the one currently driven and measured). When a particular resonant circuit is connected to ground, a voltage divider is formed between the impedance of the resonant circuit, and the source impedance (represented by block 61) of oscillator (clock) 60 and amplifier 62. When the steel blade or the conductive part that is located the closest to the given coil moves, the metal or conductive material from the blade will absorb more or less energy from the electromagnetic field, varying the quality factor (losses) and the inductance of the coil. This will vary the impedance of the resonant circuit. This impedance will be reflected in a difference in the peak-to-peak voltage at the fixed driving frequency, which is detected by a peak detector 74. The value is then provided to an analog-to-digital (A/D) converter 76, and then to controller 64. Controller 64 monitors the four resonant circuits sequentially, and compares the values from two opposing resonant circuits along the same axis to provide differential detection.

By measuring impedance, rather than the change in frequency as in some prior art designs, more sensitivity and more resolution are obtained. This is due to the impedance change being caused by two cumulative effects. First, the quality factor will decrease as the amount of metal absorbing losses increases (more metal close to the coil forms a metal core which shows worse magnetic performance than air at high frequencies). Second, at the same time, the absorption of energy by magnetic coupling toward the metal plate reduces the apparent inductance itself (by forming a secondary winding in short-circuit).

Figure 10:
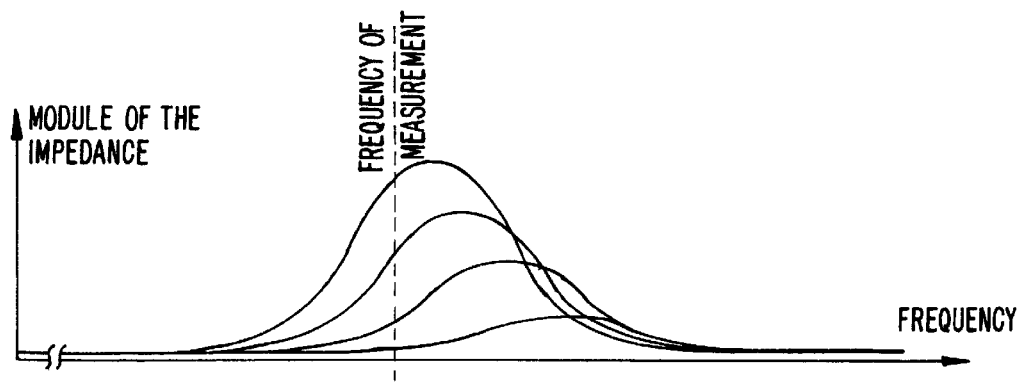
FIG. 10 is a plot of the module of impedance vs. frequency showing the variation with blade distance.

The losses in the inductor affect the quality factor (the "over-voltage factor") of the resonant L-C circuit; the more losses in the inductor, the more the curve of the module of the impedance of the resonant circuit Vs frequency is flattened and the lower becomes the peak value of that impedance module (first effect). At the same time, as an additional effect, that peak of impedance slightly moves towards higher frequencies (that is: the free natural resonant frequency is augmented as the inductance of the coil decreases due to increasing magnetic coupling toward a secondary winding in short-circuit) (second effect). Both effects affect the impedance of the circuit, in the same direction (cumulative effect), provided only that the driving/measuring frequency is chosen lower than the minimal resonant frequency. FIG. 10 illustrates this combined movement. (N.B. with ferrite, almost only the inductance would be affected, but in the other direction: the closer the ferrite to the coil, the lower the frequency. The quality factor would not be affected, provided that the type of ferrite would be adapted to the frequency in use in the resonant circuit).

Basically, the electronic circuitry measures the module of the impedance of the parallel resonant L-C circuits at a given (fixed) frequency. That frequency at which the measurement is done is preferably a bit lower than the free natural resonance of the parallel L-C circuits in absence of metal, so that when the free natural resonance of the parallel L-C circuit increases in presence of metal, it can never be equal to the measurement frequency as it will always be higher. Thus the increase of the natural resonance frequency cannot disturb the main measured effect which is the decrease of the quality factor. Quite the reverse, the increase of the natural resonance frequency will even help by decreasing the module of the impedance at the frequency of measurement, thus increasing the measured/desired effect. In one embodiment, this means the free natural frequency is set higher when the metal plate is bent to its maximum distance away from the coil (not at the joystick center position).

If ferrite particles are used in an electromagnetic element connected to the stick, rather than a steel blade, an opposite effect may be achieved, wherein the frequency changes in the other direction, providing a lower frequency instead of a higher frequency. Accordingly, it would be desirable to select a natural frequency which is lower than the frequency at which the measurement is done.

In a preferred embodiment, oscillator 60 operates at approximately 4 megahertz (MHz). By using a frequency of greater than 1 MHz, the coil can be made small enough so that it can be physically built using traces on a PCB board. Using a frequency higher than approximately 8 MHz could produce excessive EMI. In one embodiment, oscillator 60 is the same oscillator used to drive controller 64 which can be a microcontroller or microprocessor. Thus, a savings in parts is achieved. In one embodiment, amplifier 62 could be a simple CMOS logic gate. In a preferred embodiment, the resonant circuits are tuned at approximately 4.3 MHz, and operate with a 4 MHz clock.

As will be understood by those of skill in the art, the present invention may be embodied in other specific forms without departing from spirit or essential characteristics thereof. For example, a single coil along an axis could be used, rather than differential detection. Alternately, more than two axes with more than 4 coils could be used. A single metal blade could be used which slides from one coil to another. Different PCBs could be used for different coils, and the coils could be in different planes. In addition, the present invention can be used not only in a joystick, but any other mechanism requiring a similar movement, such as a rudder, a steering wheel, or other pointing devices for a computer or otherwise. Accordingly, the foregoing description is intended to be illustrative, but not limiting, of the scope of the invention which is set forth in the following claims.

What is claimed is:

1. A joystick comprising:
    a stick mounted to allow movement;
    first and second coils arranged at orthogonal positions with respect to said stick;
    first and second electromagnetic members each connected at one end to said stick, such that as said stick moves in line with one of said members, an amount of overlap of said electromagnetic member over one of said coils varies due to movement of said stick.

2. The joystick of claim 1 wherein said overlap is varied by a translational movement of said electromagnetic member parallel to said coil.

3. The joystick of claim 1 wherein said overlap is varied by a rotating movement of said electromagnetic member.

4. The joystick of claim 3 wherein said first and second members comprise V-shaped elements connected to said stick by first and second arms, respectively.

5. The joystick of claim 1 wherein said overlap is varied by a flexing of said electromagnetic members.

6. The joystick of claim 5 wherein each of said electromagnetic members have a first end connected to said stick, and a second end connected to a platform supporting said first and second coils.

7. The joystick of claim 1 further comprising an electric circuit for providing an output signal corresponding to movement of said stick, said electric circuit being mainly responsive to a change in quality factor of said coils.

8. The joystick of claim 1 further comprising:
    third and fourth coils opposite said first and second coils, respectively; and
    third and fourth electromagnetic members each connected to said stick and being positioned over said third and fourth coils, respectively.

9. The joystick of claim 8 further comprising an electric circuit for providing differential output signals corresponding to a difference between the quality factor of said first and third coils, and the difference between the quality factor of said second and fourth coils.

10. The joystick of claim 8 further comprising an electric circuit for measuring the quality factor of each coil and a digital calculator for computing differences between individual output signals corresponding to a difference between the quality factor of said first and third coils, and the difference between the quality factor of said second and fourth coils.

11. The joystick of claim 1 wherein said electromagnetic members also provide a centering force for said stick.

12. The joystick of claim 1 further comprising an insulating layer between said coils and said electromagnetic members.

13. The joystick of claim 1 wherein said electromagnetic members comprise steel plates.

14. The joystick of claim 1 wherein said electromagnetic members comprise a nonconductive substrate containing ferrite particles.

15. The joystick of claim 1 wherein said first and second coils are traces on a printed circuit board.

16. The joystick of claim 9 wherein second ends of said electromagnetic members are connected to said printed circuit board, such that each of said members is in contact with a portion of a corresponding one of said coils in a rest position.

17. The joystick of claim 16 wherein an overlapped portion of said coils varies between 10–25 percent minimum overlap and 75–90 percent maximum overlap.

18. The joystick of claim 1 further, comprising:
    a plurality of capacitors, each coupled to one of said coils to form a resonant circuit;
    an oscillator driver coupled to said coils for driving said resonant circuits; and
    an impedance measuring circuit coupled to a node between said resonant circuits and said oscillator driver.

19. The joystick of claim 1 further, comprising:
    a single capacitor, coupled to each of said coils when it is selected for measurement, to form a resonant circuit;
    an oscillator driver coupled to said coils for driving said resonant circuits; and
    an impedance measuring circuit coupled to a node between said resonant circuits and said oscillating driver.

20. The joystick of claim 1 further comprising:
    a plurality of capacitors, each coupled to one of said coils to form a resonant circuit;
    an oscillator driver coupled to said coils for driving said resonant circuits, said oscillator having a frequency of at least one MHz; and
    wherein said coils comprise traces on a printed circuit board.

21. The joystick of claim 1 further comprising:
    a single capacitor, coupled to each of said coils when it is selected for measurement, to form a resonant circuit;
    an oscillator driver coupled to each of said coils for driving said resonant circuits, said oscillator having a frequency of at least one MHz; and
    wherein said coils comprise traces on a printed circuit board.

22. A joystick comprising:
    a stick mounted to allow movement;
    a printed circuit board having first and second coils arranged at orthogonal positions with respect to said stick;
    first and second electromagnetic members each connected at one end to said stick, such that as said stick moves in line with one of said members, an amount of overlap of said electromagnetic member over a corresponding one of said coils varies due to movement of said stick;
    third and fourth coils opposite said first and second coils, respectively;

third and fourth electromagnetic members each connected to said stick and being positioned over said third and fourth coils, respectively; and an electric circuit for providing differential output signals corresponding to a difference between the quality factor of said first and third coils, and the difference between the quality factor of said second and fourth coils.

23. A joystick comprising:

a stick mounted to allow movement;

a substrate having first and second electromagnetic elements arranged at orthogonal positions with respect to said stick;

third and fourth electromagnetic elements, each connected at one end to said stick, such that as said stick moves in line with one of said members, an amount of overlap of one of said third and fourth elements over one of said first and second elements varies due to movement of said stick;

wherein two of said elements are coils, and the other two of said elements are an electromagnetic member.

24. An electric circuit for measuring the movement of a joystick, wherein said joystick includes electromagnetic elements and coils with relative movement between them, comprising:

a plurality of capacitors, each coupled to one of said coils to form a resonant circuit;

an oscillator driver coupled to said coils for driving said resonant circuits; and an impedance measuring circuit coupled to a node between said resonant circuits and said oscillator driver.

25. An electric circuit for measuring the movement of a joystick, wherein said joystick includes electromagnetic elements and coils with relative movement between them, comprising:

a single capacitor, coupled to each of said coils when it is selected for measurement, to form a resonant circuit;

an oscillator driver coupled to said coils for driving said resonant circuits; and an impedance measuring circuit coupled to a node between said resonant circuits and said oscillator driver.

26. The electric circuit of claim 24 wherein said coils comprise traces on a printed circuit board.

27. The electric circuit of claim 24 wherein said resonant circuits have a resonant frequency different than a frequency of said oscillator driver.

28. The electric circuit of claim 24 wherein a frequency of said oscillator driver is between one and eight MHz.

29. An electric circuit for measuring the movement of a joystick, wherein said joystick includes electromagnetic elements and coils with relative movement between the electromagnetic elements and the coils, comprising:

a plurality of capacitors, each coupled to one of said coils to form a resonant circuit;

an oscillator driver coupled to said coils for driving said resonant circuits, said oscillator having a frequency of at least one MHz; and wherein said coils comprise traces on a printed circuit board.

30. An electric circuit for measuring the movement of a joystick, wherein said joystick includes electromagnetic elements and coils with relative movement between the electromagnetic elements and the coils, comprising:

a single capacitor, coupled to each of said coils when it is selected for measurement, to form a resonant circuit;

an oscillator driver coupled to said coils for driving said resonant circuits, said oscillator having a frequency of at least one MHz; and wherein said coils comprise traces on a printed circuit board.

31. A position input device for a personal computer that offers a similar function as a mouse for controlling the movement of a cursor on the screen, wherein said input device comprises:

a plurality of coils formed as traces on a printed circuit board;

at least one capacitor coupled to said coils;

electromagnetic elements positioned to allow relative movement between said coils and said electromagnetic elements;

an oscillator driver coupled to said coils, said oscillator having a frequency of at least 1 MHz; and means for measuring the impedance of resonant circuits formed by said coils and said at least one capacitor, such that relative movement is detected by the effect it causes on the quality factor of each coil.

32. A position input device for electronic gaming station, wherein said input device includes:

a plurality of coils formed as traces on a printed circuit board;

at least one capacitor coupled to said coils;

electromagnetic elements positioned to allow relative movement between said coils and said electromagnetic elements;

an oscillator driver coupled to said coils, said oscillator having a frequency of at least 1 MHz; and means for measuring the impedance of resonant circuits formed by said coils and said at least one capacitor, such that relative movement is detected by the effect it causes on the quality factor of each coil.

33. The position input device of claim 32 wherein said device is one of a game steering wheel, a game rudder and a game pad.

* * * * *